United States Patent [19]

Owen

[11] Patent Number: 4,795,970
[45] Date of Patent: Jan. 3, 1989

[54] ELECTRICAL APPARATUS

[75] Inventor: David P. Owen, Dunstable, United Kingdom

[73] Assignee: Marconi Instruments Limited, Essex, England

[21] Appl. No.: 54,763

[22] Filed: May 27, 1987

[30] Foreign Application Priority Data

May 28, 1986 [GB] United Kingdom ............... 8612904

[51] Int. Cl.⁴ .......................................... G01R 23/16
[52] U.S. Cl. .................... 324/77 R; 324/78 R
[58] Field of Search ............. 324/77 R, 78 R, 78 D, 324/78 Z, 79 R, 79 D; 364/484

[56] References Cited

U.S. PATENT DOCUMENTS 3,304,504  2/1967  Horlander .................. 324/79 D
3,909,714  9/1975  Nakano ..................... 324/78 D
4,420,809  12/1983 Pierce ...................... 324/78 D Primary Examiner—Stewart J. Levy
Assistant Examiner—Louis M. Arana
Attorney, Agent, or Firm—Lowe, Price, LeBlanc, Becker & Shur

[57] ABSTRACT

Apparatus for measuring frequency includes a first period measuring counter (14) arranged to measure a periodic signal and generate a counter enable signal an integer number of cycles long, and a second period measuring counter (15) arranged to measure frequency of an input signal over a gate period given by the counter enable duration. The apparatus may be used to remove dither in the measurement of carrier frequency of FM signals.

11 Claims, 5 Drawing Sheets

ELECTRICAL APPARATUS

This invention relates to electrical apparatus. In particular but not exclusively it relates to electrical apparatus for measuring frequency. Apparatus according to the invention may be used to efficiently measure the carrier frequency and modulation characteristics of a modulated signal.

The problem with making measurements on a frequency modulated signal is that the frequency is continually changing. Generally, an averaging meter is used to obtain measurements of carrier frequency; a continuous frequency measurement is made over a known time period to give an average. FIG. 1 shows a frequency against time plot for a frequency modulated signal, from which it is seen that the times of measurement must occur at the same point TA in the modulation cycle on each cycle in order to accurately and consistently measure the carrier frequency, i.e., the period of measurement of the averaging meter must correspond with the modulation period of the signal. This synchronism is not usually achieved with averaging meters and if the period is out of synchronisation, as shown by time period TB in the figure, then the perceived carrier frequency will vary from its true value, for example in the figure between B1 and B2, and as B1, B2 varies with the phase of the modulation frequency value will drift or "dither". An averaging meter must therefore take measurements over several cycles of the modulated signal before averaging can be achieved and a reasonably accurate result obtained.

Similarly, in a conventional modulation meter, it is required to take many measurements in rapid succession on an audio signal. However, since the audio frequency may be of the order of 10 Hz, or thereabouts, long measurement times are required to avoid instability and dither. The present invention provides an apparatus for enabling modulation signals to be measured over just one cycle of the modulating signal, and for making carrier frequency measurements which substantially ignore the modulation frequencies and hence significantly reduce effects of dither.

According to the present invention there is provided electrical apparatus for measuring a frequency modulated signal and including means for demodulating a frequency modulated input signal to obtain a signal varying at the modulation frequency, a counter enable signal generator adapted to generate a counter enable signal of duration substantially equal to an integer number of cycles of the modulation frequency, and a first period measuring counter adapted to measure the carrier frequency of the input signal over a gate period given by the counter enable signal duration.

Preferably the counter enable signal generator is a second period measuring counter, arranged to additionally measure the modulation frequency. The second period measuring counter thus generates a counter enable signal a whole number of modulation cycles long and the first period measuring counter is arranged to measure the carrier frequency of the FM signals.

The frequency modulated input signal may be down converted to an intermediate frequency before processing by the apparatus, typically using a mixer and local oscillator. The intermediate frequency (IF) signal may then be passed to an FM discriminator to obtain an output, dependant upon the modulation, which is used as an input to the second period measuring counter to obtain the counter enable signal.

A period measuring counter as used in embodiments of the present invention is known and is described in further detail below. In apparatus according to the invention, it is used to generate a counter enable signal for gating a frequency measurement such that the measurement is taken over a whole number of input cycles, thus synchronising the frequency measurement cycle with the modulation cycle.

The counter enable signal necessary for the operation of the first period measuring counter according to the invention need not necessarily be generated by a second period measuring counter if it is not required to measure the modulation or audio frequency. Any suitable gate circuit may be used for this purpose, and suitable logic circuits are easily designed according to known principles. For instance, a single flip-flop would be suitable in certain cases. It is seen that the counter enable signal should be synchronous with the modulation signal so that full benefit is achieved from apparatus according to the invention.

It is also within the scope of the invention that a single period measuring counter could be used which is time-shared and would, for instance, measure carrier frequency over one cycle of the counter enable signal and modulation frequency over a second cycle.

In a second aspect of the invention, the periodic signal may alternatively be an amplitude modulated signal. An envelope detector may be used to detect the modulating signal, which is applied to the first period measuring counter to generate the counter-enable signal a whole number of modulation cycles long.

By means of voltage to frequency conversion, the first period measuring counter may be used to measure other parameters of AM signals, as will be further described, the gate time derived from the second period measuring counter ensuring that the measured frequencies are independent of the effects of modulation, and hence that the voltages derived from these measurements are stable and free from dither.

Apparatus according to the present invention may also be used to measure voltages of unmodulated AC signals, after a v-f conversion stage. Since the counter enable period is a whole number of cycles a voltage measurement can be achieved, free from periodic fluctuation.

In order to avoid rounding errors caused by the digital nature of the counters, it may in some circumstances be desirable to provide means for retiming the gate period to contain an integer number of output cycles from the voltage to frequency converter.

Embodiments of the invention will now be described by way of example only with reference to the accompanying drawings, in which.

Figure 1:
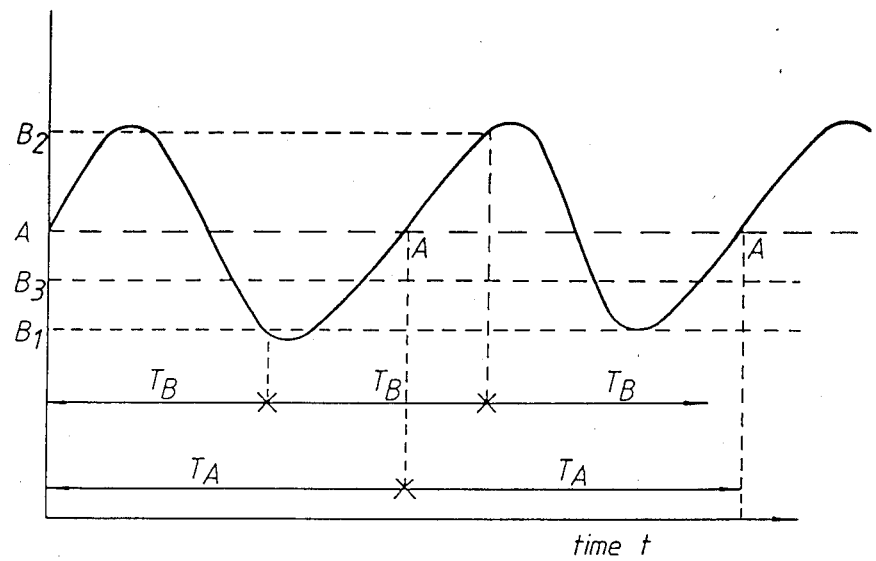
FIG. 1 shows a frequency against time plot for a typical frequency modulated signal, showing the effects on measurement accuracy of dither.
Figure 2:
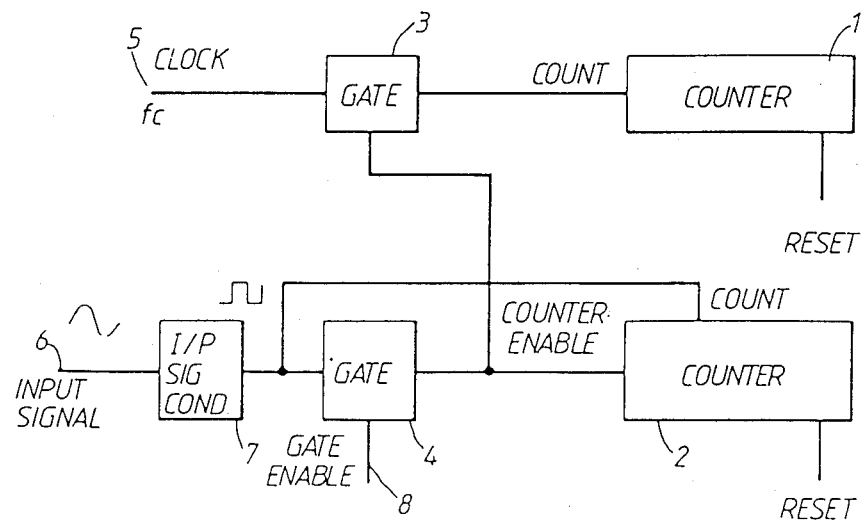
FIG. 2 shows a period measuring counter.

A period measuring counter as used in the present invention is shown in FIG. 2. It comprises two resettable counters 1 and 2 each connected to a gate 3 and 4 respectively. A clock input 5 is applied to gate 3 and the input signal 6 applied to gate 4 via a signal condition circuit 7 which detects positive transitions of the signal. Operation of the unit is as follows: the input signal 6 is used to generate an enable signal 8, enabling gate 4. A nominal gate time is set. The next positive transition of the input signal 6 sets the counter enable from gate 4 high. Gate 3 is therefore opened and transmits clock signals to counter 1. At this point both counters 1 and 2 are counting. After a nominal gate time the gate enable from counter 4 goes low. Upon the next signal input cycle therefore the counter enable from gate 4 goes low and both counters 1 and 2 stop counting. The input signal frequency fs can then be shown to be $$fs = \frac{\text{clock frequency} \times \text{reading from counter 2}}{\text{reading from counter 1}} \quad (1)$$

counters 1 and 2 can then be reset.

In this way, accurate measurements of frequency can be obtained, the resolution of which is determined by the clock frequency 5 and gate time set. It is seen that the counter enable period is a whole number of cycles of the input signals. If the gate time is set sufficiently low, the counter enable period will be equal to one period of the input signal 6.

Figure 3:
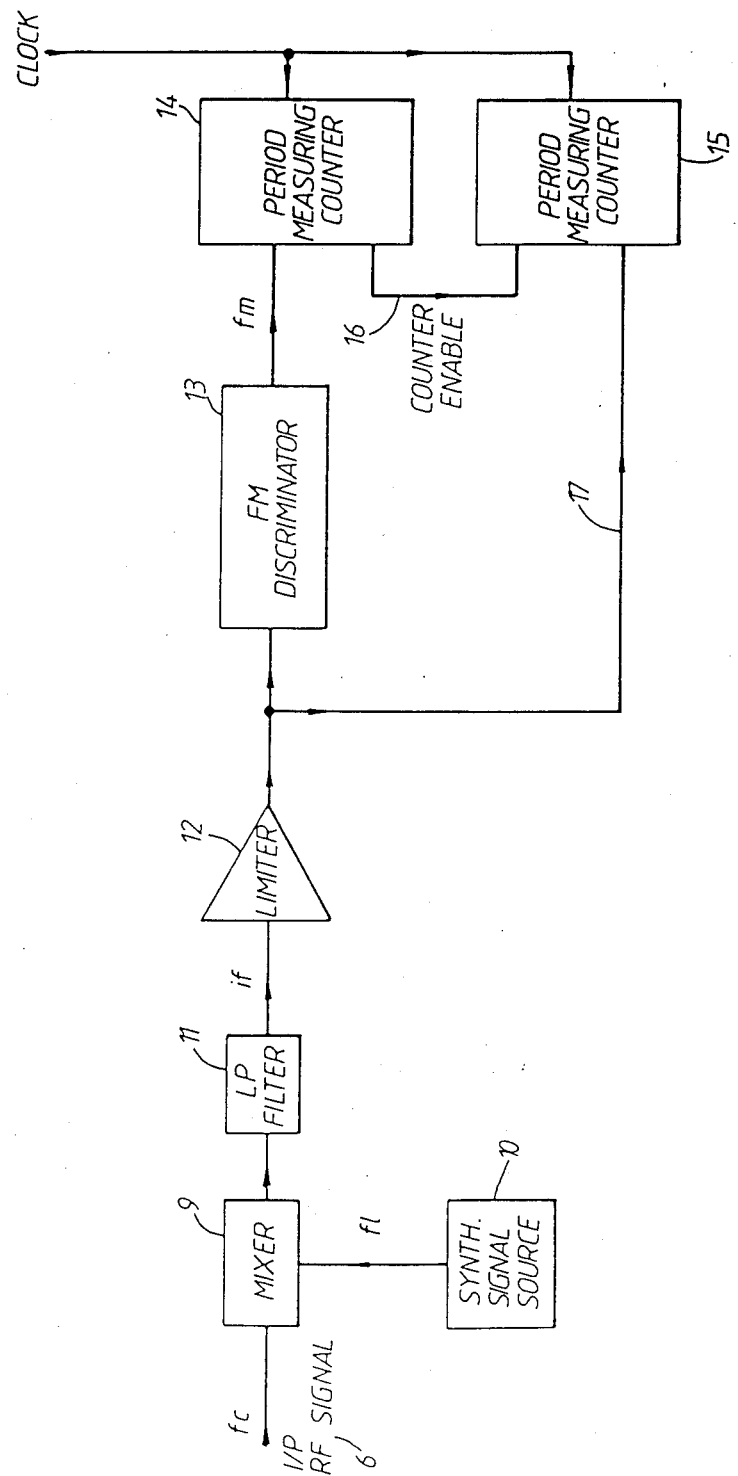
FIG. 3 shows apparatus according to the present invention for measuring a frequency modulated signal.

FIG. 3 shows an apparatus for use in measuring carrier frequency of a signal modulated by low frequency FM. The apparatus can be succesfully applied to modulation analysers and receivers.

The input signal 6, having carrier frequency fc modulated by signal fm, is down converted in a mixer 9 by being mixed with a signal fl from a local oscillator 10. The resulting intermediate frequency fi is given by $$fc = fi + fl \quad (2)$$

The intermediate frequency signal is then passed in turn through a low pass filter 11 and limiter 12. The signal is then passed to an FM discriminator 13 which is of conventional form and servesto demodulate the carrier to produce an audio output dependent upon the modulation signal fm. The frequency fm is measured by period measuring counter 14. The counter enable line 16 from measuring counter 14 is used to enable a second period measuring counter 15. As stated above, the period of the signal on the counter enable line 16 is inevitably a whole number of modulation cycles. Period measuring counter 15 is connected to directly measure the intermediate frequency fi via line 17. Since period measuring counter 15 is enabled to make measurements over a whole number of modulation cycles, a consistent result is obtained, substantially unaffected by dither. The initial carrier frequency fc can then be calculated from (2) above. Using this apparatus both carrier frequency fc and modulation frequency fm can be measured.

Figure 4:
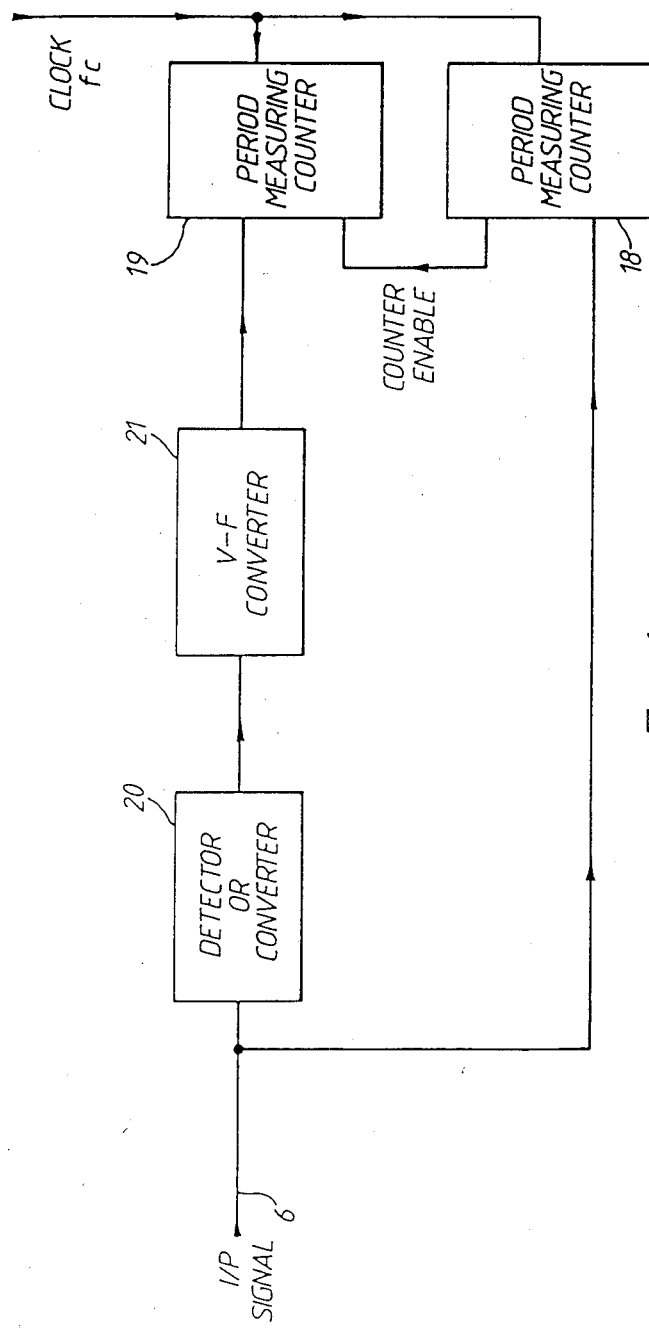
FIG. 4 shows apparatus according to the present invention for measuring audio voltage and frequency.

FIG. 4 shows apparatus embodying the present invention which may be used to measure the voltage and frequency of an AC unmodulated signal. The signal may be of audio frequency, say, up to 30 KHz, although a modulation meter may cover a range 1 Hz to 300 KHz or even greater. The AC signal 6 is applied to a first period measuring counter 18 which measures the frequency of the signal as described above with reference to FIG. 2 and also generates a counter enable signal a whole number of cycles long.

The input signal is also applied to a detector or converter 20, which may be a true RMS converter or a rectifier, and subsequently to a voltage to frequency converter 21. The output from v-f converter 21 is proportional to the input voltage in the form $fo = KV_i + C$ where K and C are constants and $V_i$ is the input voltage.

The output, $f_o$, from v-f converter 21 is then applied to and measured by period measuring counter 19 using a gate time derived from counter 18. Since, as described above, period measuring counter 19 is enabled for a whole number of cycles of the input signal the measured frequency remains steady. In this apparatus, the frequency variation of the output signal from v-f converter 21 with the input wave form 6 is automatically integrated over a whole cycle.

Figure 5:
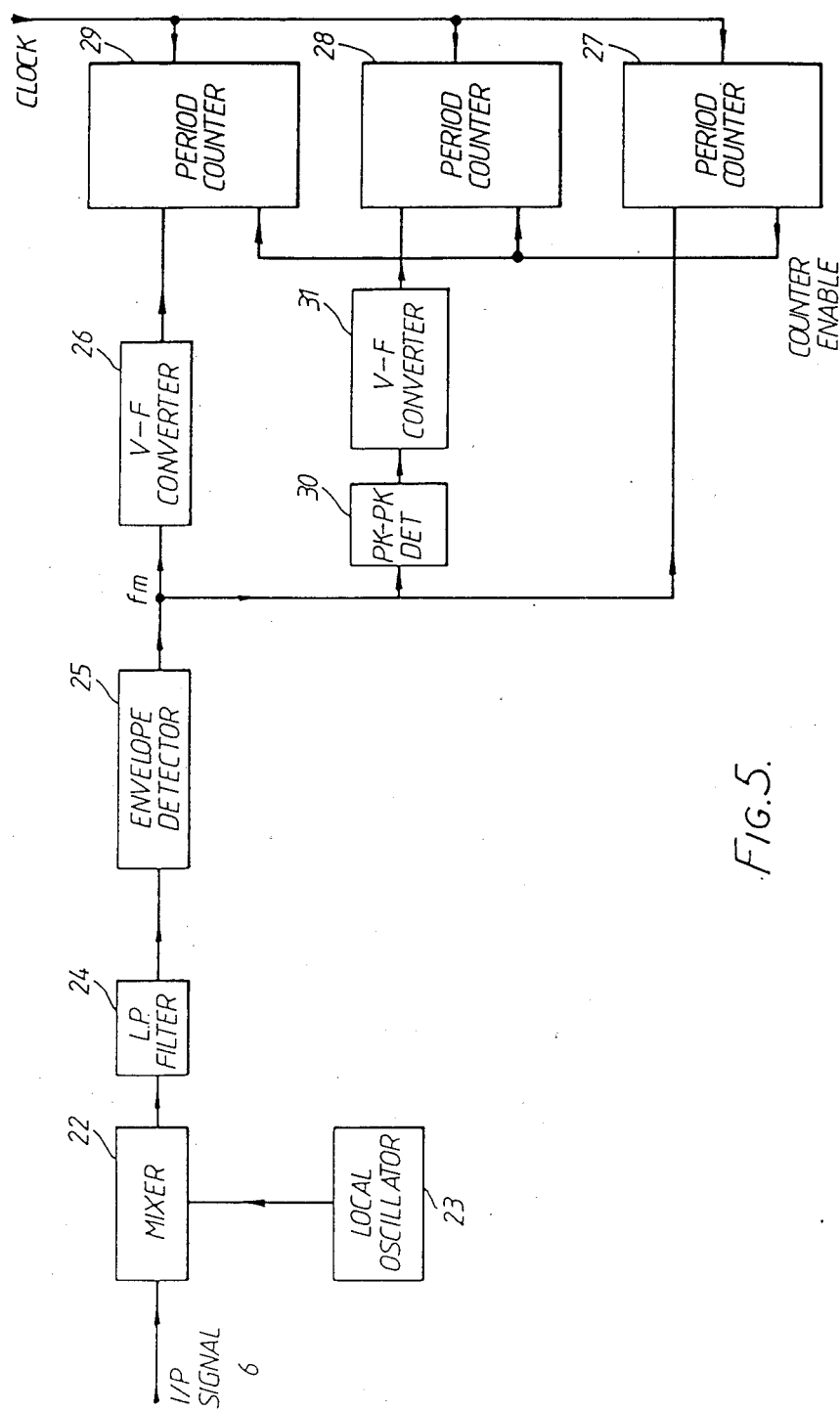
FIG. 5 shows apparatus according to the invention for measuring AM signals.

In FIG. 5 a third set of apparatus is shown which embodies the present invention. This apparatus may be used for the measurement of AM, Amplitude Modulated Signals. An amplitude modulated input signal 6 is down converted to a suitable intermediate frequency $f_i$ by means of mixer 22 and local oscillator 23. The intermediate frequency is passed through a low pass filter 24 to an envelope detector 25 operating in conventional fashion to separate out the modulating signal fm. The modulating signal fm is then passedto a first period measuring counter 27 which measures its frequency and also produces a counter enable signal, a whole number of modulation cycles long, which is applied to two further period measuring counters 28 and 29 in parallel.

The signal from envelope detector 25 is also applied to a voltage to frequency converter 26 and to a peak-peak detector 30. The output signal from v-f converter 26 is measured by period counter 29, which is of course enabled by period measuring counter 27. The signal measured by period measuring counter 29 is seen to be the average carrier level.

The signal from the peak-peak detector 30 is applied to a second v-f converter 31 and subsequently to the third period measuring counter 28. Period counter 28 therefore measures the peak-peak envelope of the signal.

It is ofter required to measure the AM depth of an amplitude modulated signal, which is defined by $$AM = 100 \times \frac{\text{Peak-peak envelope}/2}{\text{Average carrier level}} \quad (3)$$

By direct substitution of the values measured by period measuring counters 28 and 29 into the above formula the AM depth can be calculated. Since the measurements are taken over whole cycles of the wave form, then if the modulation remains constant then v-f converter 26/period counter 29 and v-f converter 31/period counter 28 could be "time-shared" if desired, measuring alternately each cycle for example. The voltage to frequency conversion achieved by converters 26 and 31 in this apparatus represent a convenient way, embodying the invention, in which voltages may be measured for a modulating signal and avoids the dither which would otherwise be noted in the measured voltages.

The above three embodiments show the diverse ways in which apparatus according to the invention may be utilised. They all share the same basic idea that a period measuring counter is used to generate a counter enable signal for measuring frequency and/or voltage over a whole number of input cycles.

Referring back to FIG. 2 and the description above of a period measuring counter it is seen that measurements from apparatus according to the present invention are by default taken at the fatest appropriate rate. The nominal gate time set by gate enable 8 may be any desired value and is not crucial to the results obtained. For example, a gate time of 10 milliseconds may be selected. If the frequency of the input signal is say, 1 kHz, i.e, having 1 ms period, then approximately 10 cycles of the input occur during one gate period and the counter enable will be set for the appropriate number of whole cycles. If the frequency of the input signal changes to, for example, 10 Hz, i.e, a period of 100 ms, then it is seen that since the counters remain enabled until the next positive transition of the signal a measurement will take place over a period of 100 ms, even though the gate time has elapsed. Hence, measurements will always be taken over at least one cycle of the input and always over a whole number of cycles.

Since measurements using embodiments of the present invention involve synchronisation, it is possible to measure the characteristics of audio bursts.

Since the apparatus described above uses digital techniques, it is effected to some extent by rounding errors. In particular, the resolution of the system is effectively given by the clock frequency since it is clock pulses that are counted by counter 1 of FIG. 2. Referring back to the period measuring counter shown in and described with reference to FIG. 2, it has been shown that the count from counter 1 is defined to be a precise number of input cycles. However, the count from counter 2 is subject to a $+/-$ one count uncertainty, since it starts counting at a point determined by the gate enable and ceases counting at the first clock pulse following the end of the gate enable. Given a high clock frequency, this effect is not in itself significant.

Figure 6:
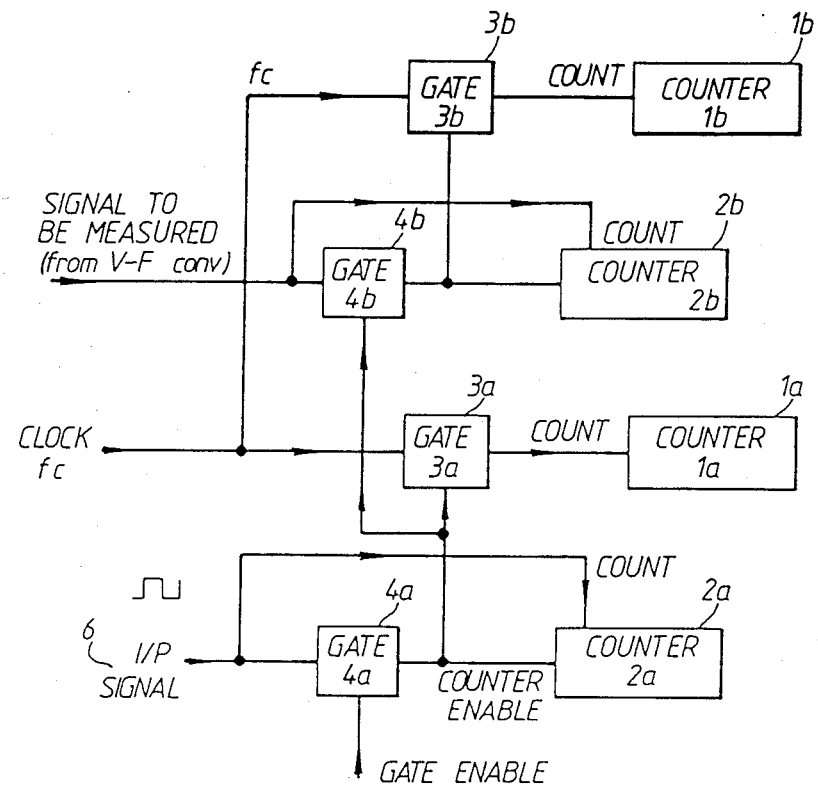
FIG. 6 shows apparatus used for minimising rounding errors.

In the systems described above using the period measuring counter, however, since the gate time is determined by the counter enable from counter 2 of FIG. 2 then the count from frequency counters such as counters 15 and 19 is also susceptible to the $+/-$ one count error. FIG. 6 shows an apparatus which can be used to retime the gate period from the counter equivalent to counter 2 such that it contains a whole number of input cycles and hence avoids rounding errors. This apparatus may be used in systems which use a v-f converter. In the apparatus, the functioning of gates 3A and 3B are equivalent to that of gate 3 in FIG. 2 and gates 4A and 4B are equivalent to gate 4. In addition to the initial input signal 6, which is measured by counters 1A and 2A as described with reference to FIG. 2, a further input is taken from the v-f converter which is measured by counters 1B and 2B. The input frequency of the signal will generally be fairly high, for example 10 kHz having a period of 0.1 ms compared to the nominal gate time of, say, 10 ms. The signal from the v-f converter is used in the apparatus to retime the gate period so that it contains an integer number of input cycles, i.e. the input from the v-f converter and hence avoids the rounding error described above. In fact, the gate time will not now be precisely one cycle of the audio modulation and hence the "dither" in the measurement is not completely eliminated. However, since rounding errors are avoided by this apparatus the overall value obtained for the frequency remains more consistent and accurate than previously.

I claim:

1. Electrical Apparatus for measuring a frequency modulated signal and including means for demodulating a frequency modulated input signal to obtain a signal varying at the modulation frequency, a counter enable signal generator adapted to generate a counter enable signal of duration substantially equal to an integer number of cycles of the modulation frequency, and a first period measuring counter adapted to measure the carrier frequency of the input signal over a gate period given by the counter enable signal duration.

2. Apparatus as claimed in claim 1 wherein the counter enable signal generator is a second period measuring counter, arranged to additionally measure the modulation frequency.

3. Apparatus as claimed in claim 1 wherein the demodulating means comprises an FM discriminator.

4. Apparatus as claimed in claim 1 including means for converting an input signal to an intermediate frequency signal and for applying this signal to the first period measuring counter and the counter enable signal generating means.

5. Electrical apparatus for measuring an amplitude modulated signal and including an envelope detector to which the input amplitude modulated signal is applied, a counter enable signal generator adapted to generate a counter enable signal of duration substantially equal to an integer number of cycles of the voltage varying output from the envelope detector, a voltage to frequency convertor for converting the voltage varying output signal from the envelope detector to a frequency varying signal, and a first period measuring counter adapted to measure the frequency of the varying frequency signal over a gate period given by the counter enable signal duration.

6. Apparatus as claimed in claim 5 further including: means for applying the input amplitude modulated signal, after envelope duration, also to a detector of the peak to peak voltage amplitude of a signal; a second voltage to frequency converter connected to the output of the peak to peak detector; a further period measuring counter arranged to measure the frequency of the output signal from the second voltage to frequency converter; and means for applying the counter enable signal as a gate signal for the further period measuring counter.

7. Electrical apparatus for measuring an AC signal and including a counter enable signal generator adapted to generate a counter enable signal of duration substantially equal to an integer number of cycles of the AC signal, a detector or convertor and a voltage to frequency convertor for converting the voltage varying AC signal to a frequency varying signal, and a first period measuring counter adapted to measure the frequency of the varying frequency signal over a gate period given by the counter enable signal duration.

8. Apparatus as claimed in claim 7 wherein the counter enable signal generator is a second period measuring counter, arranged to additionally measure the frequency of the AC signal.

9. Apparatus as claimed in claim 7 wherein the detector or convertor is an FM discriminator or an AM detector.

10. Apparatus as claimed in claim 5 or claim 7 further comprising means for retiming the gate period to contain an integer number of output cycles from the voltage to frequency converter.

11. Apparatus as claimed in claim 4 wherein the converting means comprises a mixer and a local oscillator.

* * * * *